(12) United States Patent
Inoue

(10) Patent No.: US 6,999,315 B2
(45) Date of Patent: *Feb. 14, 2006

(54) RADIATOR MECHANISM AND ELECTRONIC APPARATUS HAVING SAME

(75) Inventor: Koichi Inoue, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/913,400

(22) Filed: Aug. 9, 2004

(65) Prior Publication Data

US 2005/0007738 A1 Jan. 13, 2005

Related U.S. Application Data

(60) Continuation of application No. 10/350,271, filed on Jan. 24, 2003, now Pat. No. 6,778,391, which is a division of application No. 10/077,857, filed on Feb. 20, 2002, now Pat. No. 6,724,625, which is a division of application No. 09/696,952, filed on Oct. 27, 2000, now Pat. No. 6,519,149.

(30) Foreign Application Priority Data

Mar. 31, 2000 (JP) .............................. 2000-097564

(51) Int. Cl.
*H05K 7/20* (2006.01)

(52) U.S. Cl. ...................... 361/700; 361/695; 361/719; 174/15.2; 174/16.1; 165/80.3; 165/80.4; 165/104.26

(58) Field of Classification Search ................ 361/689, 361/690, 694–700, 704, 719–721; 257/714, 257/715; 174/15.1, 15.2, 16.1, 16.3; 165/80.3, 165/80.4, 185; 454/184

See application file for complete search history.

(56) References Cited

U.S. PATENT DOCUMENTS

| 5,288,961 A | 2/1994 | Shibuya et al. ............. 219/690 |
| 5,502,618 A | 3/1996 | Chiou ........................ 361/695 |
| 5,504,650 A | 4/1996 | Katsui et al. ............... 361/697 |
| 5,559,674 A | 9/1996 | Katsui ........................ 361/697 |
| 5,650,912 A | 7/1997 | Katsui et al. ............... 361/697 |
| 5,694,294 A | 12/1997 | Ohashi et al. .............. 361/687 |
| 5,731,953 A | 3/1998 | Sakurai ...................... 361/695 |
| 5,810,554 A | 9/1998 | Yokozawa et al. .......... 415/176 |
| 5,910,694 A | 6/1999 | Yokozawa et al. ............ 310/89 |
| 5,940,267 A | 8/1999 | Katsui et al. ............... 361/697 |
| 5,953,208 A | 9/1999 | Katsui ........................ 361/697 |
| 5,969,940 A | 10/1999 | Sano et al. ................. 361/687 |
| 6,049,455 A | 4/2000 | Nakamura et al. |

(Continued)

FOREIGN PATENT DOCUMENTS

EP 0 572 326 12/1993

(Continued)

*Primary Examiner*—Boris Chervinsky
(74) *Attorney, Agent, or Firm*—Armstrong, Kratz, Quintos, Hansen & Brooks, LLP

(57) ABSTRACT

It is an exemplified object of the present invention to provide a radiator mechanism and electronic apparatus having the radiator mechanism that can prevent destruction, deterioration, and malfunction due to heat of exoergic components or other electronic components, thermal deformation of a housing thereof, and low-temperature burn, without preventing the electronic apparatus including a printed board from miniaturization. The radiator mechanism is comprised of a cooling fan and a through hole provided in a motherboard, thereby thermally protecting a variety of circuit components mounted on the motherboard to provide a stable operation.

14 Claims, 7 Drawing Sheets

U.S. PATENT DOCUMENTS

| | | | |
|---|---|---|---|
| 6,052,285 A | 4/2000 | Hileman | |
| 6,067,227 A | 5/2000 | Katsui et al. | 361/695 |
| 6,118,655 A | 9/2000 | Mecredy, III et al. | 361/687 |
| 6,122,169 A | 9/2000 | Liu et al. | 361/700 |
| 6,141,218 A | 10/2000 | Miyahara | 361/695 |
| 6,151,214 A * | 11/2000 | Yeh | 361/695 |
| 6,230,790 B1 | 5/2001 | Hemingway et al. | |
| 6,288,896 B1 | 9/2001 | Hsu | |
| 6,366,460 B1 | 4/2002 | Stone et al. | |
| 6,366,463 B1 | 4/2002 | Hamano | |
| 6,407,921 B1 | 6/2002 | Nakamura et al. | |

FOREIGN PATENT DOCUMENTS

| | | |
|---|---|---|
| EP | 0 616 366 | 9/1994 |
| EP | 0 893 828 | 1/1999 |
| EP | 0 908 949 | 4/1999 |
| EP | 0 939 442 | 9/1999 |
| EP | 0 939 443 | 9/1999 |
| JP | 6-13364 | 2/1994 |
| JP | 6-268125 | 9/1994 |
| JP | 7-130924 | 5/1995 |
| JP | 08-023529 | 1/1996 |
| JP | 9-172282 | 6/1997 |

* cited by examiner

RADIATOR MECHANISM AND ELECTRONIC APPARATUS HAVING SAME

CROSS-REFERENCE TO RELATED APPLICATION

This application is a continuation of application Ser. No. 10/350,271, filed Jan. 24, 2003, now U.S. Pat. No. 6,778,391 which is a division of application Ser. No. 10/077,857, filed Feb. 20, 2002, now U.S. Pat. No. 6,724,625, issued Apr. 20, 2004, which is a divisional of prior application Ser. No. 09/696,952, filed Oct. 27, 2000, now U.S. Pat. No. 6,519,149, issued Feb. 11, 2004, by the same applicant.

BACKGROUND OF THE INVENTION

The present invention relates generally to radiator mechanisms, and more particularly to a radiator mechanism that includes a cooling fan for dissipating heat derived from exoergic circuit components (or heat-producing components) mounted in an electronic apparatus. The present invention is suitable, for example, for a mounting method of the cooling fan for various types of circuit components mounted on a motherboard in a notebook personal computer (PC) or the like.

The motherboard (or main board) in the notebook PC is mounted with the circuit components such as a CPU socket, a variety of memory (sockets), a chipset, an expansion slot, and a BIOS ROM, and directly affects performance and functionality of the PC.

The notebook PCs in recent years tend to include increased number of exoergic components and to generate more calorific values from the various circuit components, as the circuit components mounted on the motherboard provide higher speed and higher performance. Therefore, in order to thermally protect the exoergic components and other circuit components mounted directly or via a socket or the like on the motherboard, the motherboard is provided with a cooler called heat sink.

The heat sink typically includes a cooling (or radiating) fin made up of many high-thermal-conductivity members, and cools exoergic components by spontaneous air cooling. However, the calorific values from exoergic components tend to become too high in recent years to be adjusted by the spontaneous air cooling. Therefore, a fan-cum-heat sink further including a cooling fan has been proposed to enhance a cooling effect of the heat sink. The fan-cum-heat sink provides forced-air cooling to the heat sink utilizing air currents produced by a fan. A conventional fan-cum-heat sink is typically provided above a CPU on the motherboard, as the calorific value from the CPU is the highest among other components.

The cooling fan may be classified into two types: a lateral type that orients perpendicular to one surface of the motherboard; and a longitudinal type that orients parallel with the surface of the motherboard. However, the lateral type is more suitable than the longitudinal type that requires substantial space allocation to a certain thickness for recent notebook PCs required to have a thin (or low-profile) body.

However, the exoergic components are mounted also on a reverse surface of the motherboard opposite to a surface on which the heat sink is mounted. In a conventional embodiment, the calorific values derived from these components are almost negligible, but increased speed and enhanced functionality in recent years have made these calorific values nonnegligible, and influences such as destruction, deterioration, and malfunction due to heat of the exoergic components and other circuit components, thermal deformation of the housing accommodating the motherboard, low temperature burn, and the like have been increasing accordingly. Therefore, the necessity has been arising for the motherboard to be cooled at the both sides (front and back surfaces) in recent years.

To remove the necessity, it would be a conceivable plan to provide cooling fans at the both sides, but this plan would entail increased manufacturing costs, increased power consumption for driving the cooling fans, and increased noise caused by driving the cooling fans.

In this respect, a radiator mechanism that cools both sides of a motherboard using one cooling fan is proposed as disclosed in Japanese Laid-Open Utility Model Application, Publication No. 6-13364. The radiator mechanism 10, as shown in FIG. 7, includes an outer frame 1, a cooling fan 2, fixing tonguelet pieces 3, a connector 4, a motherboard 5, and a connector 6. FIG. 7 is a schematic perspective view of the conventional radiator mechanism 10. The outer frame 1 is fixed in a through hole provided in the motherboard 5 via the fixing pieces 3 and screws (not shown) provided at both sides of the outer frame 1. As a result, the connectors 4 and 6 are electrically connected with each other, and the cooling fan 2 is electrically connected with the motherboard 5.

The cooling fan 2 shown in FIG. 7 has the outer frame 1 embedded in the motherboard 5, and thus may cool the both sides of the motherboard 5 at the same time. In addition, a shift of a mounting position of the fixing pieces 3 provided on the outer frame 1 in an up or down direction to an arbitrary spot would vary a mounting height of the outer frame 1 relative to the motherboard 5, so that a surface generating more calorific value may be effectively cooled.

However, the cooling fan 2 is the longitudinal type, and thus is not suitable for a low-profile notebook PC as described above. Accordingly, a radiator mechanism that can efficiently cool the both sides of the motherboard without preventing the notebook PC from achieving a slim body has been in increasing demand.

BRIEF SUMMARY OF THE INVENTION

Therefore, it is an exemplified general object of the present invention to provide a novel and useful radiator mechanism and electronic apparatus having the radiator mechanism in which the above disadvantages are eliminated.

Another exemplified and more specific object of the present invention is to provide a radiator mechanism and electronic apparatus having the radiator mechanism that can prevent exoergic components and other electronic components from suffering destruction, deterioration, and malfunction due to heat, a housing accommodating these components from suffering thermal deformation and low-temperature burn, and the electronic apparatus including a printed board from achieving a slim body.

In order to achieve the above objects, a radiator mechanism as one exemplified embodiment of the present invention comprises a board on which an exoergic part is to be mounted, the board including a through hole, and a cooling fan that orients perpendicular to one surface of the board. The cooling fan can dissipate heat from the one surface, and the through hole allows the cooling fan to dissipate through the through hole heat from a back surface of the one surface. Since this radiator mechanism includes a lateral type cooling fan, a housing of an electronic apparatus that accommodates the printed board is not prevented from miniaturizing so much as in case a longitudinal type cooling fan is used. The cooling fan does not employ the through hole for dissipating heat at a surface on which the cooling fan is provided. The through hole has dimensions enough to allow the cooling fan to cool the back surface. As a result, heat at the back surface may easily be dissipated as well with a single cooling fan. The cooling fan is typically provided on the board, but may be provided at a side of the housing that accommodates the board.

The above radiator mechanism may further comprise a heat sink, and the above cooling fan may be provided in the heat sink. In this case, the fan-cum-heat sink may have an enhanced cooling capability, and is provided with the cooling fins and cooling fan in the same plane, which contributes to a slimmed body of the radiator mechanism. The above exoergic part is, for instance, a processor, the above board is, for instance, a motherboard, and the above cooling fan is, for instance, is provided at a side of the same surface of the motherboard on which the processor is provided. The processor conceptually includes a CPU. In this case, the radiator mechanism may utilize the cooling fan for CPU in the fan-cum-heat sink, which is conventionally provided, without an additional cooling fan, for the inventive radiator mechanism, so that the cooling fan may have expanded functionality.

The above radiator mechanism may further comprise a heat pipe, and the above cooling fan may be configured to dissipate heat conducted via the heat pipe. The above heat pipe and the above heat sink may be thermally connected. The heat pipe may be disposed between the one surface and the back surface of the one surface, via the through hole. In this case, the radiator mechanism allows the heat pipe, if joined with a specific heat-producing source (exoergic member), to cool the specific portion efficiently and intensively.

The above cooling fan may include an intake connected to the thorough hole. In this case, the cooling fan may dissipate heat at the back surface via the intake and the through hole. The intake may be pierced thorough the housing that accommodates the cooling fan.

An electronic apparatus as one exemplified embodiment of the present invention comprises a board that includes first and second surfaces, and a through hole pierced through the first and second surfaces; exoergic parts mounted on the first and second surfaces of the board; a cooling fan that orients perpendicular to the first surface and dissipates heat from the first surface, while dissipating heat from the second surface via the through hole; and a housing that accommodates the board and the cooling fan. This electronic apparatus has the above-described radiator mechanism, and thus may efficiently cool the both sides of the board while keeping a slimmed body of the housing. This electronic apparatus is suitably applicable to notebook PCs, word processors, personal digital assistants (PDAs), and other portable electronic apparatuses (such as portable game machines, and varied types of drives).

The above electronic apparatus may further comprise a heat sink having many fins, the above cooling fan and the cooling fins may constitute a fan-cum-heat sink, and the cooling fan and the cooling fins may be disposed in the same plane. In this case, the fan-cum-heat sink may have an enhanced cooling capability, and is provided with the cooling fins and cooling fan in the same plane, which contributes to a slimmed body of the fan-cum-heat sink itself. One of the above exoergic part is, for instance, a processor, the above board is, for instance, a motherboard, and the above cooling fan is, for instance, is provided at a side of the same surface of the motherboard on which the processor is provided. The processor conceptually includes a CPU. In this case, if the above electronic apparatus is embodied as a notebook PC, a high-heat-dissipation-performance low-profile notebook PC may be provided. Further, the electronic apparatus may utilize the cooling fan for CPU in the fan-cum-heat sink, which is conventionally provided in a normal notebook PC, without an additional cooling fan, for the inventive electronic apparatus, so that the cooling fan may have expanded functionality.

The above electronic apparatus may further comprise a heat pipe, and the above cooling fan may be configured to conduct heat via the heat pipe. In this case, the electronic apparatus allows the heat pipe, if joined with a specific heat-producing source (exoergic member), to cool the specific portion efficiently and intensively.

The above cooling fan may include an intake connected to the through hole. In this case, the cooling fan may dissipate heat at the back surface via the intake and the through hole. The above intake may be pierced through a housing that accommodates the cooling fan.

Other objects and further features of the present invention will become readily apparent from the following description of the embodiments with reference to accompanying drawings.

DETAILED DESCRIPTION OF INVENTION

Figure 1:
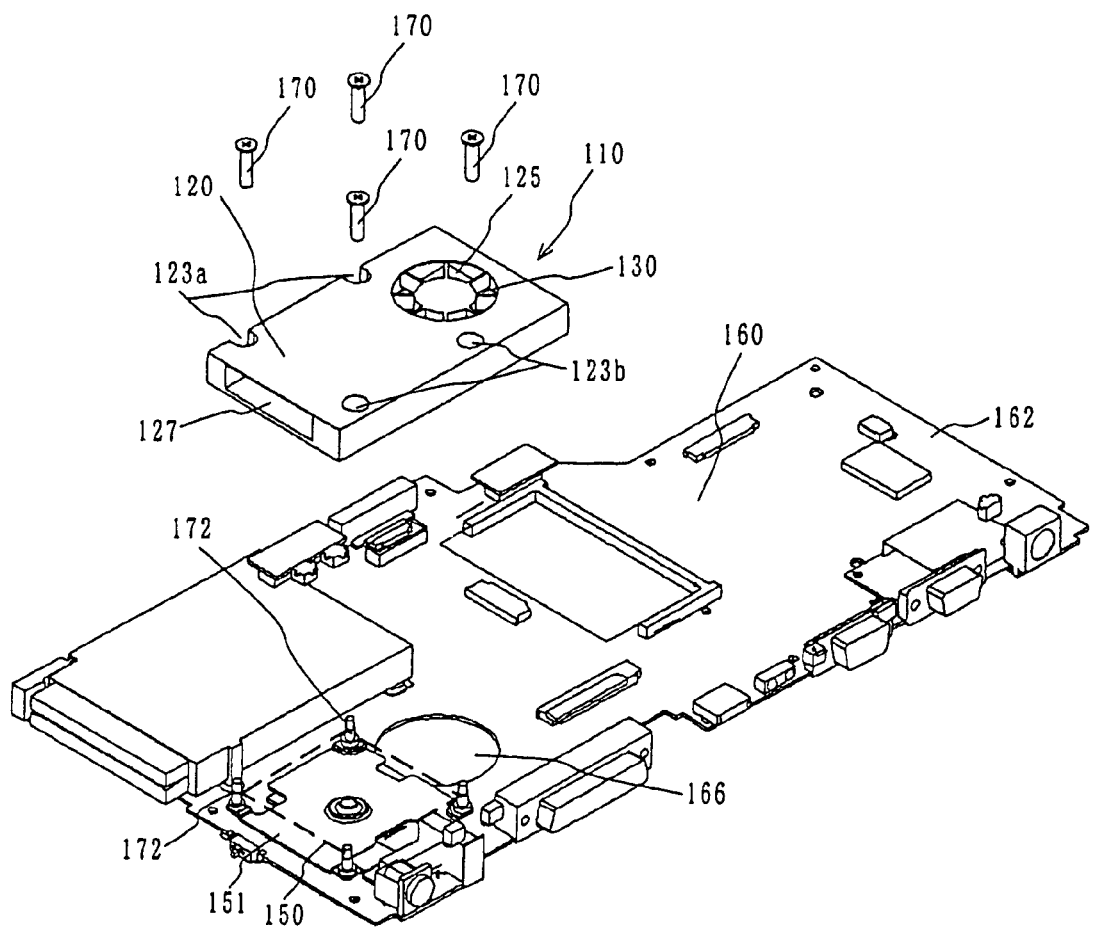
FIG. 1 is an exploded perspective view of a radiator mechanism as one exemplified embodiment of the present invention.
Figure 2:
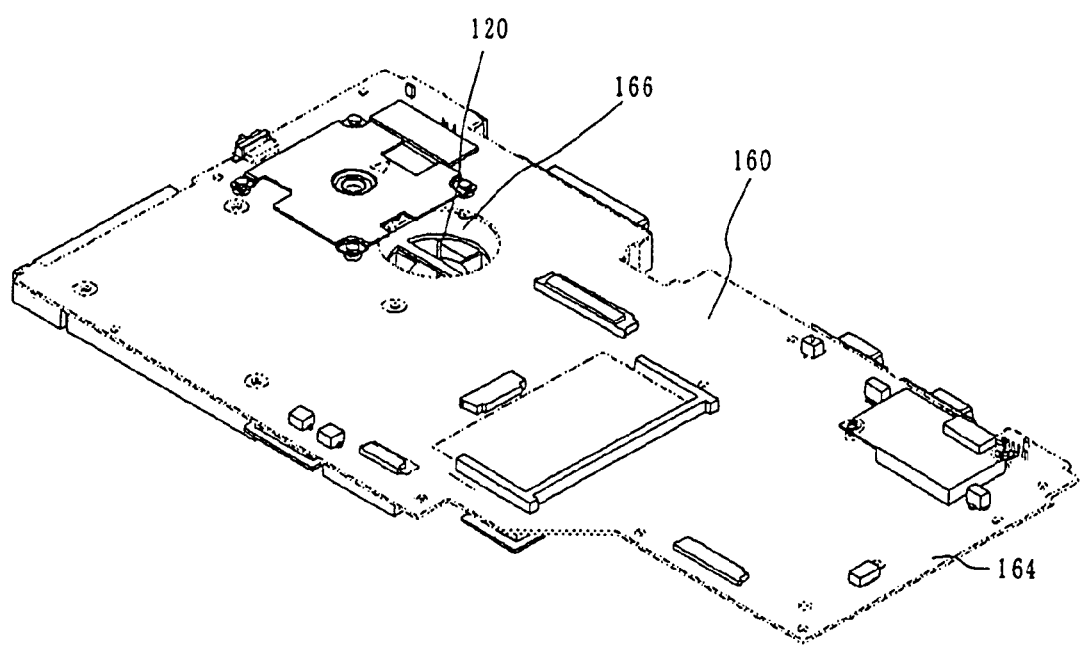
FIG. 2 is a perspective view of a motherboard in the radiator mechanism shown in FIG. 1 as viewed from a back thereof.
Figure 3:
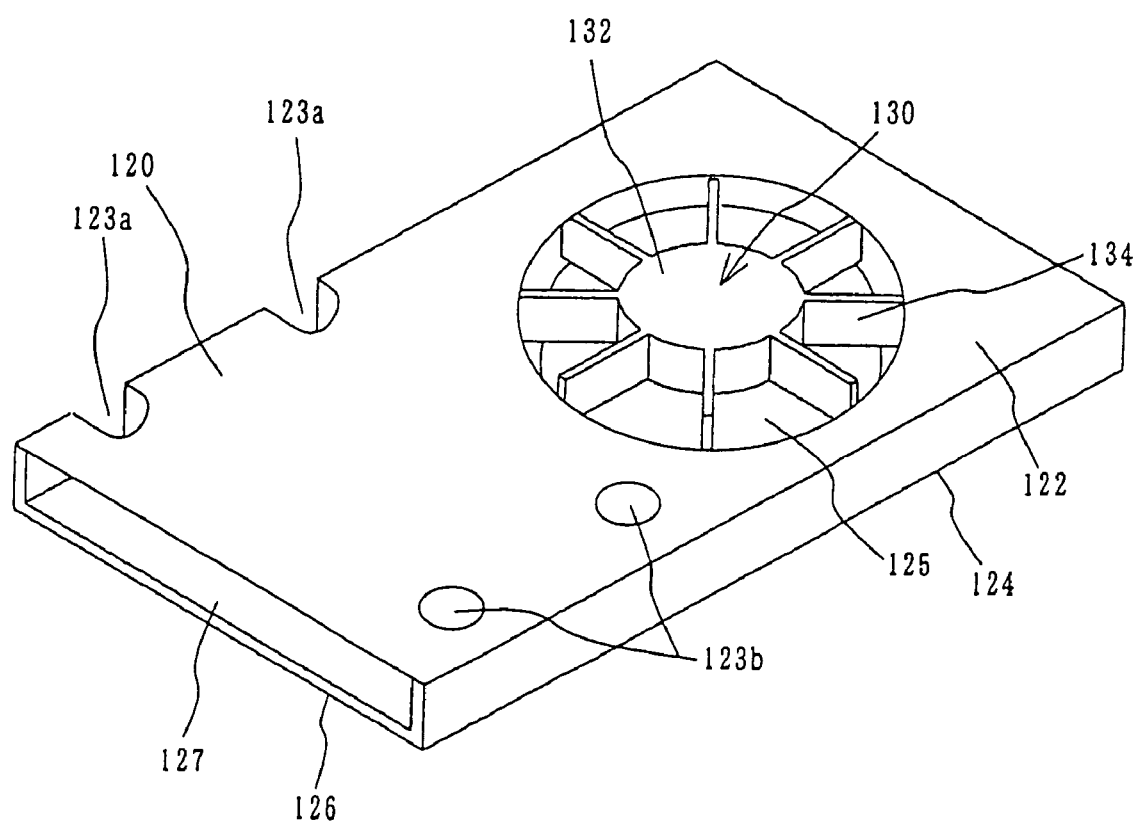
FIG. 3 is a magnified perspective overview of a fan-cum-heat sink in the radiator mechanism shown in FIG. 1.
Figure 4:
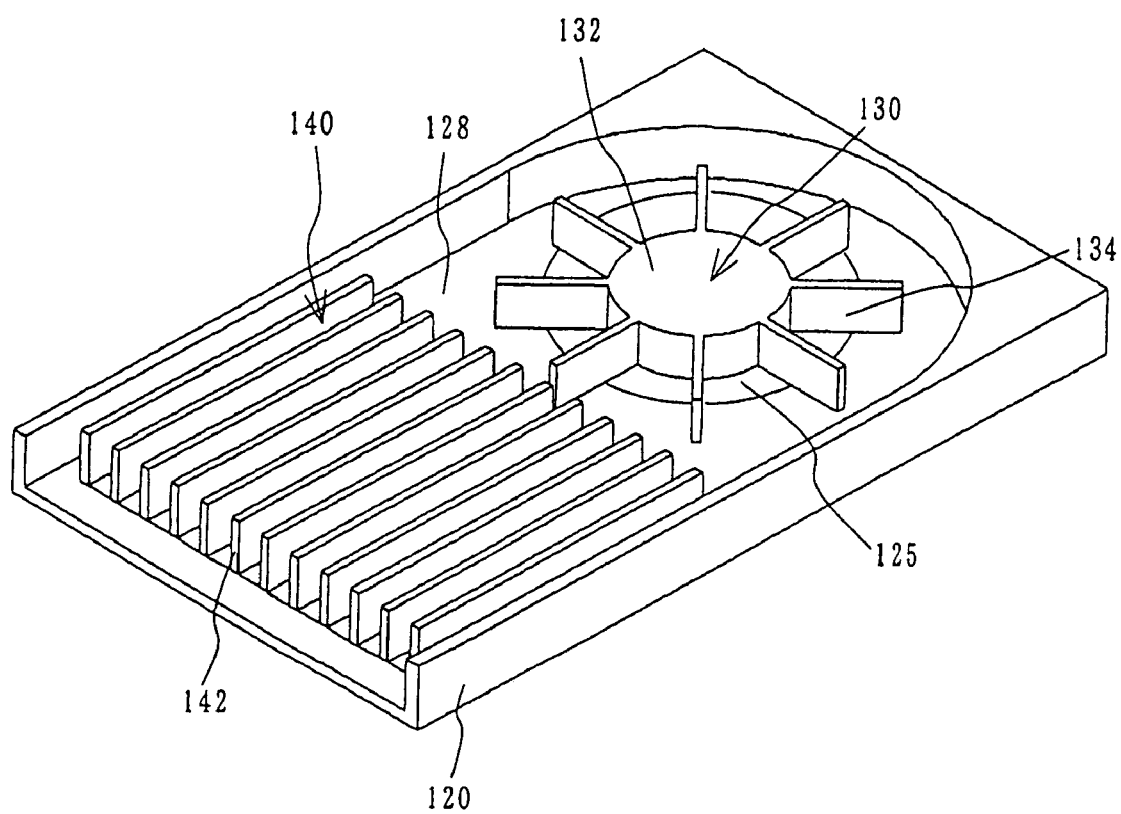
FIG. 4 is a perspective view for illustrating an inside of the fan-cum-heat sink shown in FIG. 3.

Referring now to FIGS. 1 to 4 inclusive, a description will be given of a radiator mechanism 100 as an exemplified embodiment of the present invention. The inventive radiator mechanism includes at least a lateral type-cooling fan, but the present embodiment employs a cooling fan 130 in a fan-cum-heat sink 110. The radiator mechanism 100 in the present embodiment is comprised of the fan-cum-heat sink 110, and a motherboard 160 provided with a through hole 166. FIG. 1 is an exploded perspective view of the radiator mechanism 100 as an exemplified embodiment of the present invention. FIG. 2 is a perspective view for illustrating a back surface of the motherboard 160 in the radiator mechanism 100. FIG. 3 is a magnified perspective overview for showing the fan-cum-heat sink 110 shown in FIG. 1. FIG. 4 is a perspective view for illustrating an inside of the fan-cum-heat sink shown in FIG. 3.

The radiator mechanism 100 in the present embodiment utilizes the fan-cum-heat sink 110 provided on the CPU 150 (or MPU: both terms indicate a processor in a broad sense; hereinafter used in a like manner) represented by a dotted line in FIG. 1 in such a manner as to get in thermal contact with the CPU 150 to cool the CPU 150. The fan-cum-heat sink 110 includes a housing 120, a cooling fan 130, and a cooling fin having a plurality of fins 142 (see FIG. 4).

The housing 120 is an approximately rectangular parallelepiped frame composed, for instance, of aluminum, copper, aluminum nitride, artificial diamond, plastic, or other high-thermal-conductivity materials, and includes a top surface 122, mounting grooves 123a, mounting holes 123b, a bottom surface 124, an intake 125, an end surface 126, an exhaust port 127, and a storage portion 128. The heat sink 110 is manufactured by sheet metal working, aluminum die casting, or other processes. The housing 120, if made of plastic, may be formed, for example, by injection molding. Apart of the housing 120 (e.g., a cooling fan 130 and a cooling fin 140) may be configured to be separable.

The intake 125 is, to be specific, provided as holes on both sides at a top surface 122 and a bottom surface 124 of the housing 120. As shown in FIG. 3, the intake 125 is pierced through the top surface 122 and the bottom surface 124. To make the matter more intelligible, referring to FIG. 4, the bottom surface 124 proves to be also provided with the intake 125. The fan-cum-heat sink 110 (as shown in FIGS. 1 and 3) can take in air from the both sides of the top and bottom surfaces 122 and 124 of the heat sink 110.

For convenience of replacement and maintenance of the cooling fan 130 and/or the cooling fin 140, the top surface 122 of the housing 120 is preferably configured to be like a lid removable from a main body including the bottom surface 124. Alternatively, a lidless heat sink as shown in FIG. 4 may be used instead of the heat sink shown in FIG. 1, but it is preferable to provide such a lid portion to reduce noise generated by rotation of the cooling fan 130.

The housing 120 accommodates the cooling fan 130 and the cooling fin 140 in the storage portion 128. The storage portion 128 includes a semicircular portion for storing the cooling fan 130, and a rectangular parallelepiped portion for storing the cooling fin 140. The storage portion 128 also serves as a wind tunnel to provide space through which airflow generated by the cooling fan 130 passes. The housing 120 may also dissipate heat from a surface thereof, and thus if necessary may make the top and bottom surfaces 122 and 124, and other surfaces protuberantly shaped so as to increase surface areas, thereby enhancing dissipation effects.

As in FIG. 1, the mounting grooves 123a and mounting holes 123b are pierced through the top and bottom surfaces 122 and 124, and are engaged with screws 170. The screws 170 may have a hollow body so as to be engageable with pins 172 pierced through a socket 151 for placement of the CPU 150 provided on the motherboard 160. The socket 151 makes the CPU 150 exchangeable. Alternatively, the screws 170 are pierced through the holes (not shown) on the motherboard 160 and fastened on the motherboard 160, if needed, via nuts (not shown), or the like. As a result, the housing 120 is secured on the motherboard 160 through the mounting grooves 123a and the mounting holes 123b, and the screws 170. However, any means for thermally connecting the housing 120 and the CPU 150 is applicable. For instance, the both elements may be bonded with a thermally conductive adhesive or by soldering (with solder paste and a reflow oven, or otherwise), or fastened by coil springs each looped over a portion projected from the mounting grooves 123a and the mounting holes 123b upon insertion of mounting pins each having a slit head from a surface 164 that will be described later on the motherboard 160.

As shown in FIGS. 1, 3, and 4, the intake 125 is pierced through the top and bottom surfaces 122 and 124 to connect the cooling fan 130 to the outside. The intake 125 is also connected to the through hole 166 that will be described later in the motherboard 160. An end surface 126 includes the exhaust port 127, which is connected to the cooling fan 130 and the cooling fin 140. The intake 125 serves to introduce hot air derived from exoergic components mounted broadly on the motherboard 160 as well as from heat generated in the CPU 150 into the housing 120.

As a result, the intake 125 can introduce, on the top and bottom surfaces 122 and 124, hot air located at a side of the surface 162 that will be described later of the motherboard 160 into the housing 120, and can introduce, on the bottom surface 124, hot air located at a side of the surface 164 that will be described later of the motherboard 160 via the through hole 166 into the housing 120. In other words, the hot air can be introduced into the housing 120 from the both sides (the surfaces 122 and 124) of the cooling fan 130. The introduced hot air is supplied to the cooling fin that will be described later by the cooling fan 130, and after heat exchange, ejected through the exhaust port 127. The introduced hot air is cooled by the heat exchange. The exhaust port 127 is connected to sheet metal for heat radiation (not shown) incorporated in a side portion 225 of the notebook PC 200 that will be described later or to a vicinity of the exhaust port 127 provided on the side portion 225. As described above, heat in the air is also dissipated from a surface of the housing 120.

The intake 125 is so large as to expose the cooling fan 130 in whole in the present embodiment, but the size may be set arbitrarily. The intake 125 may be comprised of a plurality of holes (e.g., assuming a mesh structure), if necessary.

If required, the housing 120 may include a hollow bottom portion having the bottom surface 124, in which cooling water or other refrigerants (e.g., Freon, alcohol, ammonia, galden, and fron) are contained to form a heat pipe plate. In addition, inserting a mesh (or wick) in the hollow portion, which induces a capillary phenomenon, thereby circulating cooling water, would be further effective. Moreover, the housing 120, if necessary, may be connected with an external heat pipe, or the like. This heat pipe may include a pipe that is made of aluminum, stainless steel, copper, or the like, and formed so as to have portions varied in height. The pipe has a wick material made of glass fiber, reticular thin copper wire, or the like affixed inside, and under educed pressure, stores cooling water or other refrigerants. The cooling water cools exoergic elements by repeating the following cycle: having obtained heat from the exoergic elements in a lower position, the cooling water is vaporized and moves up to a higher position, and then is spontaneously or forcefully cooled in the higher position, liquefied, and returns to the lower position. If the above heat pipe is coupled with a specific heat source, efficient and concentrated cooling can be provided for that portion.

Figure 6:
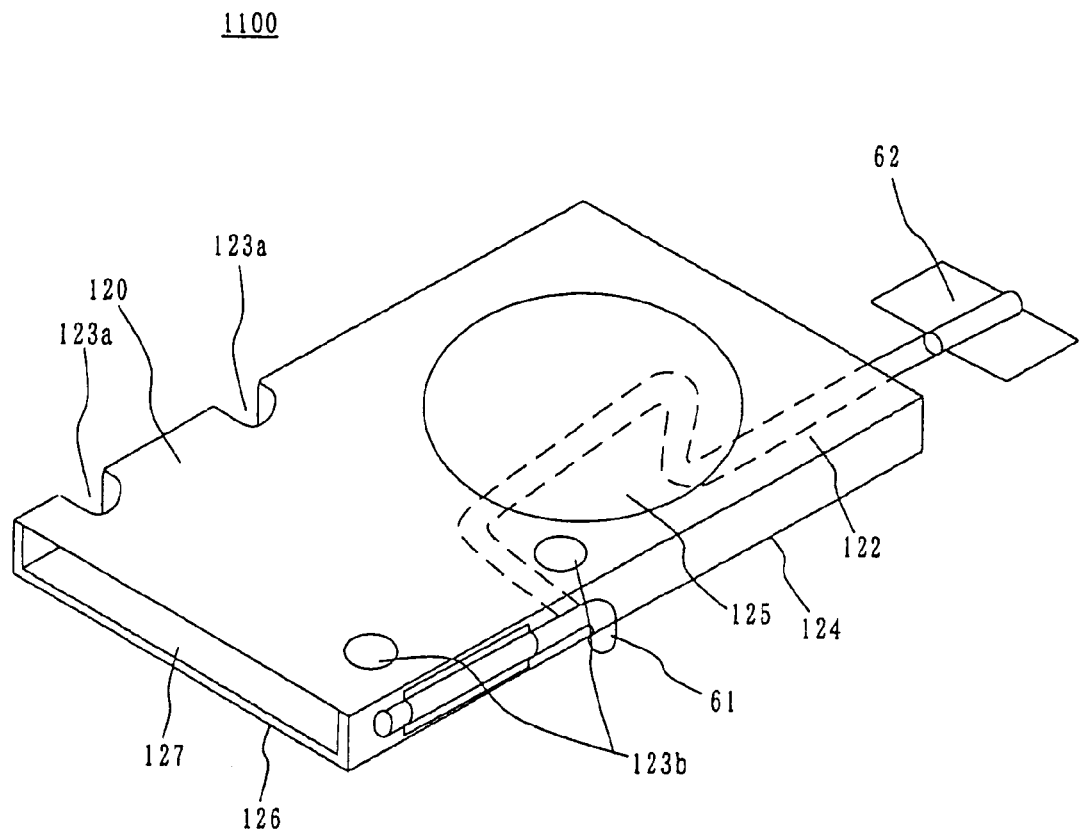
FIG. 6 is a schematic perspective view of the fan-cum-heat sink as another exemplified embodiment of the present invention.
Figure 7:
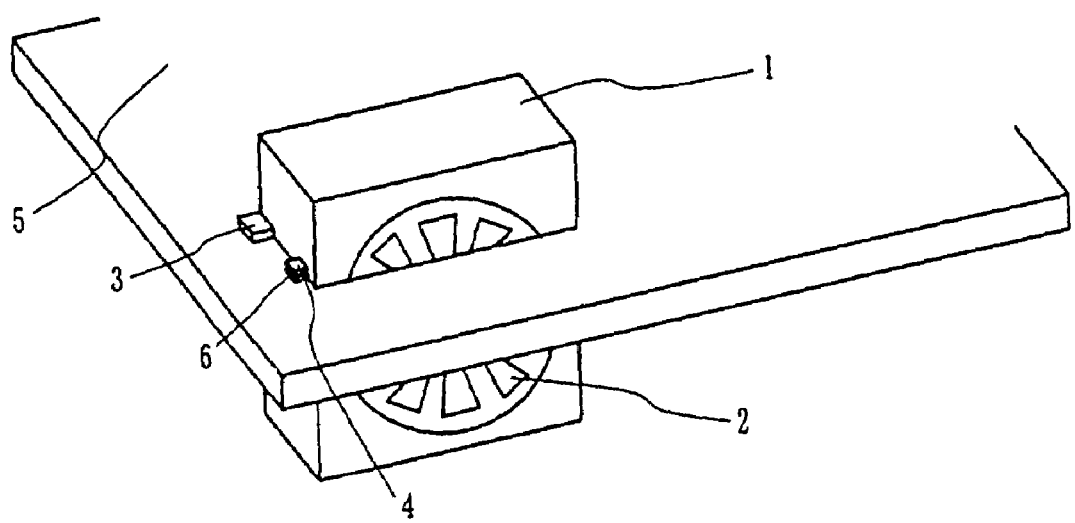
FIG. 7 is a magnified perspective overview of a conventional radiator mechanism.

As another embodiment, a heat pipe 61 connected with a fan-cum-heat sink 110 may be extended to a back surface 164 of the motherboard 160 using the through hole 166. This embodiment is shown in FIG. 6. To a side surface of the fan-cum-heat sink 1100 shown in FIG. 6 is coupled the heat pipe 61. The heat pipe 61 extends from the front surface 162 of the motherboard 160 via the through hole 166 to the back surface 164 of the motherboard 160. In a dotted portion of the heat pipe 61 in FIG. 6, a portion under the intake 125 passes through the through hole 166 of the motherboard 160. The motherboard 160 is not illustrated in FIG. 6. The heat pipe 61 is coupled with exoergic elements such as electronic components in a position indicated by 62 in the drawing at the back surface 164, and transfers heat derived therefrom to the fan-cum-heat sink 1100. Accordingly, the heat conducted via the heat pipe 61 is dissipated using the cooling fan 130. This configuration allows the through hole 166 to double as an intake from the back surface 164 and a placement of the heat pipe. A structure of the fan-cum-heat sink 1100 in FIG. 6 is the same as the fan-cum-heat sink 110 in FIGS. 1, 3, and 4 except coupling of the heat pipe 61. Therefore, an illustration of the cooling fan 130 and the like is omitted.

The cooling fan 130 rotates, produces airflow, and thereby forcefully cools the cooling fin 140. The cooling fan 130 includes a motor portion 132, a propeller portion 134 fastened to the motor portion 132. The motor portion 132 typically includes an axis of rotation, a bearing provided around the axis of rotation, a bearing house, and a magnet making up a motor, but since any structure known in the art may be applied to the motor portion 132, a detailed description will be omitted. However, in order to prevent heat transfer to the bearing house, a thermal insulation portion is preferably formed on an inner wall surface of the bearing house. The thermal insulating portion is, for example, formed of a low-thermal-conductivity material such as a fluoroplastic, a silicon resin, or the like into a thin film.

The propeller portion 134 includes a desired number of rotor blades each forming a desired angle. The rotor blades may orient so as to form equal or unequal angles, and have a desired dimension. The motor portion 132 and propeller portion 134 in the cooling fan 130 may be separable or unseparable. An illustration of wiring connected with the cooling fan 130 is omitted. As described above, the intake 125 is provided at both sides (surfaces 122 and 124) of the housing 120, and thus the cooling fan 130 may take in air from the both sides.

The cooling fan 130 in the present embodiment orients perpendicular to one surface (the front surface 162), and thus is considered to be a lateral type. This may therefore allow the notebook PC 200 in which the cooling fan 130 is included to maintain a low-profile body of the base 220. Moreover, the cooling fan 130 is placed in the same plane as the cooling fin 140 that will be described below, and this configuration also contributes to a slimmed body of the base 220 in the notebook PC 200 that will be described later. As described above, the through hole 166 of the motherboard 160 is located under the cooling fan 130.

The cooling fin 140 is comprised of neatly aligned many plate-shaped fins 142. The cooling fin 140 includes a convex portion to increase a surface area thereof, thereby enhancing dissipation effects. However, the shape of the fins 142 is not limited to one like a plate, and any placement shapes like a pin, a curve, etc. may be adopted. The fins 142 do not necessarily have to be aligned horizontally with equal spacing, but may be placed so as to be radial, or oblique relative to the bottom surface 124. Moreover, the fins 142 may be placed around the cooling fan 130. The number of the fins 142 maybe set arbitrarily. The fins 142 are preferably made of a high-thermal-conductivity material such as aluminum, copper, aluminum nitride, artificial diamond, and plastic. The fins 142 are formed by molding, a press fit, brazing, welding, injection molding, or the like.

In the storage portion 128, the CPU 150 is located immediately below a position in which the cooling fin 140 is placed. In other words, in a portion surrounded with the mounting holes 123a and the mounting grooves 123b in the storage portion 128, the cooling fin 140 is formed.

The cooling fin 140 and the CPU 150 are thermally connected, and consequently heat from the CPU 150 is efficiently transferred to the cooling fin 140. Moreover, the cooling fin 140, which receives air blowing from the cooling fan 130, may efficiently dissipate heat.

The fan-cum-heat sink 110 in the present embodiment is, in general, higher in radiative efficiency than a heat sink configured to have the cooling fan 130 placed above the cooling fin 140. This is: (1) because the cooling fan above the cooling fin blocks air from the propeller portion, reducing the amount of air to the cooling fin immediately below the motor portion, and inhibits effective cooling performance; (2) because heat producing sources in a CPU concentrate in a central portion thereof; and for other reasons. However, the cooling fin 140 in the present embodiment exhibits high radiative efficiency because no impediment is placed against convection by the motor portion 132.

Optionally, a thermally conductive elastic body (e.g., silicon rubber) may be inserted between the cooling fin 140 and the top surface 122 so that heat conducts therebetween to enhance a radiative efficiency. This structure also serves to eliminate a vibration in the cooling fin 140 caused by a rotation of the cooling fan 130 and a noise accompanied by the vibration. The thermally conductive elastic body's absorption of the vibration accompanied by the rotation of the cooling fan 130 would eventually prevent screws 170 from working loose.

The present embodiment, as described above, employs a fan-cum-heat sink. Although a heat sink is usually provided for cooling the CPU 150, if the heat sink is a fan-cum-heat sink, the inventive radiator mechanism 100 requires no more cooling fan, and the fan-cum-heat sink is configured to give versatility to the built-in cooling fan. This configuration would inhibit increased manufacturing costs, increased power consumption, and increased noise caused by driving the cooling fans that would be entailed if a new cooling fan were provided.

Further, the present embodiment employs the fan-cum-heat sink 110 in which the cooling fan and the cooling fin are disposed in the same plane instead of a fan-cum-heat sink in which the cooling fan is disposed above the cooling fin. This stricture may facilitate connecting the cooling fan 130 and the through hole of the motherboard 160. However, it is to be understood that the cooling fan 130 and the cooling fin 140 need not be disposed in the same plane, as far as connection established between the cooling fan 130 and the through hole 166 of the motherboard 130 is secured.

The cooling fan 130 used for the inventive radiator mechanism 100 is not necessarily part of the fan-cum-heat sink. For example, a heat sink only including the cooling fin 140 may be provided as a cooling device for the CPU 150, and the cooling fan 130 may be disposed in a position unrelated to the cooling fin 140. For example, the cooling fan 130 may be provided at a right-hand side (i.e., opposite the cooling fin 140) of the motherboard 160 in FIG. 1, or at the surface 164 of the motherboard 160. The cooling fan 130 need not be necessarily mounted on the motherboard 160, but may be attached on the base 220 in the notebook PC 200 that accommodates the motherboard 160, or on sheet metal for heat radiation or other members. In other words, as far as the cooling fan 130 used for the inventive radiator mechanism 100 can introduce hot air at the both surfaces 162 and 164 of the motherboard 160 via the through hole 166, and dissipate heat, it is optional whether the cooling fin 140 is to be forcefully cooled or not. For example, only a provision of ventilation by the cooling fan 130 to eject hot air at the both surfaces 162 and 164 of the motherboard 160 from a mesh of exhaust port (not shown) provided in the base 220 may suffice.

The motherboard 160 is a printed board mounted with circuit components such as a CPU socket 151, a variety of memory (sockets), a chipset, an expansion slot, and a BIOS ROM, and includes a front surface 162, a back surface 164, and a through hole 166 that is pierced through the both surfaces 162 and 164. In FIGS. 1 and 2, a variety of other circuit components to be mounted on the motherboard 160 are omitted.

Close to the CPU socket 151 are disposed a memory (SRAM, or the like), and a chipset for CPU. The chipset for CPU, which connects the CPU 150 and the memory with each other, serves to control dataflow between the CPU 150 and the memory, and is typically disposed between the CPU 150 and the memory. Both the memory and the chipset for CPU are exoergic components. The through hole 166 is provided so as not to interfere with the placement of the memory and the chipset for CPU.

The through hole 166 has a diameter of at least about 8 mm or larger, and preferably about 10 mm or larger, to provide ventilation with the back surface 164. The "about 8 mm" is intended to exclude a screw hole and inspection hole that are typically provided on the motherboard 160. Because these screw hole and the like are too small to provide ventilation. Although the through hole 164 is provided in the shape of a circle in the present embodiment, applicable shapes are not limited to this, but may include any shape such as an ellipse, and a polygon. In other words, the through hole 166 has an area of at least about $16 \pi$ mm$^2$ or larger, and preferably about $25 \pi$ mm$^2$ or larger. The through hole 166 need be connected to the cooling fan 130. The "connect" means that the cooling fan 130 is allowed to provide ventilation via the through hole 166 with the back surface 164.

The through hole 166 may be one hole having the above area, but may also be separated into multiple holes having the total area enough to meet the above area requirement when each area of the holes is summed up. In that event, the multiple holes are preferably provided in proximity to each other. The proximity should be an extent enough to secure connection between each hole and the cooling fan 130. For instance, the through hole 166 may be a mesh of holes provided on the motherboard 166. The shape and dimension of each hole may be the same as each other, or different from each other.

Figure 5:
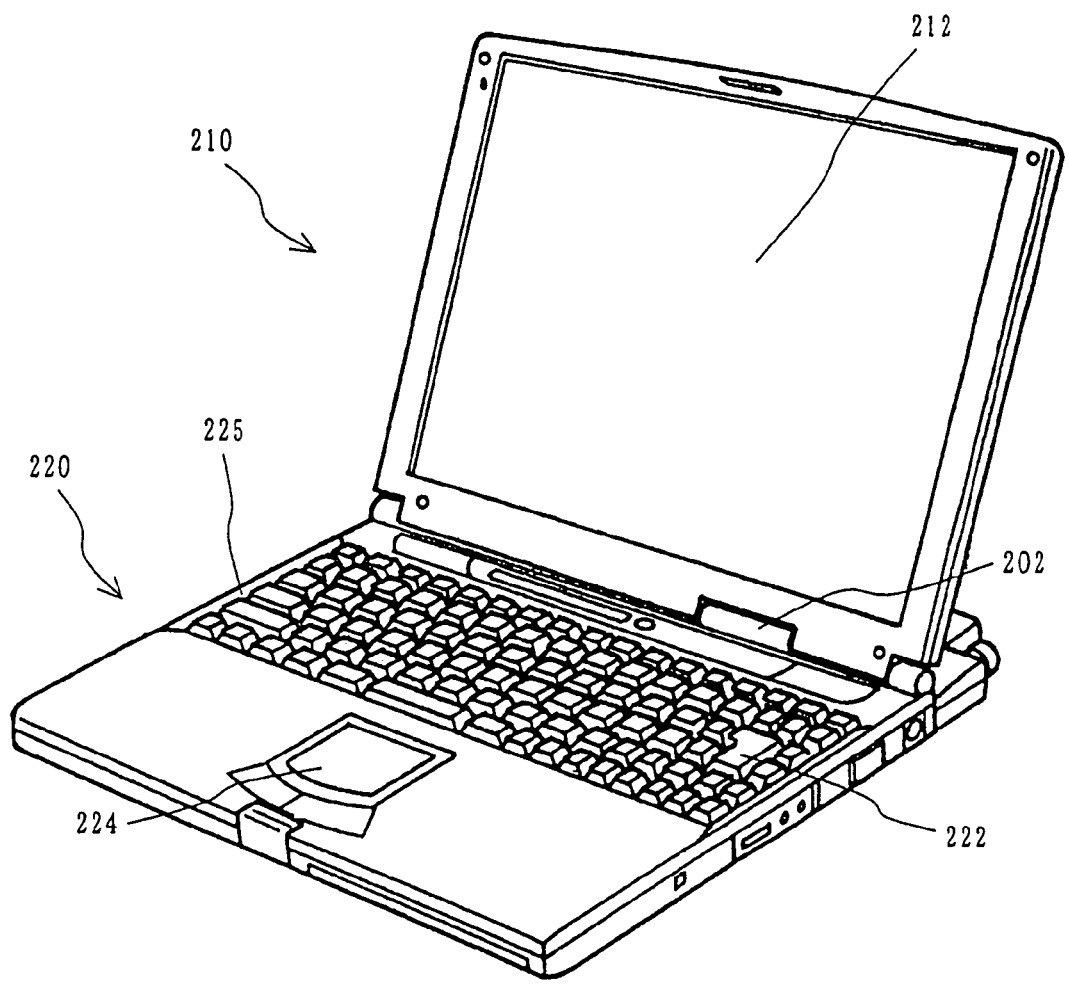
FIG. 5 is a schematic perspective view of a notebook personal computer to which the radiator mechanism shown in FIG. 1 is applicable.

An operation of the radiator mechanism 100 will be described herein, as an operation of the notebook PC 200 to which the radiator mechanism 100 is applicable. A description will now be given of the operation of the notebook PC 200, with reference to FIG. 5. FIG. 5 is a schematic perspective view of the notebook PC 200 according to the present invention. As shown in FIG. 5, the notebook PC 200 includes a liquid crystal display (LCD) bezel frame 210 and the base 220 connected with each other via a hinge 202. The LCD bezel frame 210 is provided with an LCD screen 212. Characteristically, the base 220 is made of plastic material, having a thickness of about 50 mm or less, and preferably of about 20 through about 30 mm. The inventive radiator mechanism 100 employs the fan-cum-heat sink 110, which does not dispose the cooling fan 130 above the cooling fin 140, but in the same plane, and thus maintains a low-profile body of the base 220. The LCD bezel frame 210 takes on substantially a rectangular shape so as to hold the LCD screen 212.

The base 220 includes a keyboard section 222 for typing information in, and the keyboard may use any type and arrangement. Usable types of the keyboard may include 101, 106, 109 and ergonomics, and usable key arrangements include QWERTY, DVORAK, JIS, new-JIS, and NICOLA (Nihongo Nyuryoku Conthotium Layout).

The base 220 also includes a pointing device 224 that emulates part of mouse functions. Despite the structure shown in FIG. 5, the pointing device 224 may include a mouse, a trackball, a trackpad, a tablet, a digitizer, a joystick, a joypad, a touch panel, and a stylus pen.

Moreover, the base 220 includes sheet metal for heat radiation and/or exhaust port (not shown) incorporated in a side portion 225. The sheet metal for heat radiation and/or exhaust port is connected to the exhaust port 127. To be specific, the bottom surface 124 near the exhaust port 127 may be connected with the sheet metal for heat radiation, and air emitted from the exhaust port 127 may be blown on the sheet metal for heat radiation, or emitted out from the exhaust port at the side portion 225. The temperature of the fan-cum-heat sink 110, if connected with the sheet metal for heat radiation, constantly keeps an approximately specific value (e.g., at room temperature).

In operation, a user of the notebook PC 200 operates the keyboard 222 or the pointing device 224, and executes program stored in a hard disk (not shown) included in the base 220. In that event, the CPU 150 downloads necessary data from the hard disk and ROM (not shown) into memory (not shown). Heat produced from the CPU 150 at that moment is thermally transferred via the thermally coupled housing 120 of the fan-cum-heat sink 110, and bottom surface 124 of the housing 124, to the cooling fin 140. As a result, the heat is air-cooled by itself at a surface of the cooling fin 140 and the housing 120. Moreover, air blown from the cooling fan 130 forcefully cools the cooling fin 140.

Hot air derived from the memory, CPU chipset, other exoergic components mounted on the front surface 162 of the motherboard 160 is introduced from the intake 125 to the inside of the housing 120 by the cooling fan 130 without passing through the through hole 166. The introduced hot air is exhausted from the storage portion (wind tunnel space) 128 to the exhaust port 127 by the cooling fan 130. The hot air is cooled by heat exchange with the cooling fin 140 and the housing 120 while passing through the storage portion 128. The cooling fin 140 is forcefully cooled by the cooling fan 130 as described above. Then, the air exhausted from the exhaust port 127 is blown to the sheet metal for heat radiation, and further cooled, or exhausted out from the exhaust port provided at the side portion 225.

Hot air derived from the exoergic components mounted on the back surface 164 of the motherboard 160 is introduced from the intake 125 via the through hole 166 to the inside of the housing 120 by the cooling fan 130. The introduced hot air is exhausted from the storage portion (wind tunnel space) 128 to the exhaust port 127 by the cooling fan 130. The hot air is cooled by heat exchange with the cooling fin 140 and the housing 120 while passing through the storage portion 128. The cooling fin 140 is forcefully cooled by the cooling fan 130 as described above. Then, the air exhausted from the exhaust port 127 is blown to the sheet metal for heat radiation, and further cooled, or exhausted out from the exhaust port provided at the side portion 225.

Consequently, the CPU 150 and other circuit components are thermally protected, regardless of whether on the front surface 162 or the back surface 164 of the motherboard 160. Accordingly, the circuit components in the notebook PC 200 does not suffer destruction, deterioration, or malfunction due to heat, and thus a user may carry out an intended process.

Moreover, the base 220 made of a plastic material also does not result in thermal deformation or low-temperature burn.

Although the fan-cum-heat sink 110 in the present embodiment, as has been exemplarily described above, takes in air from both of the top and bottom surfaces of the motherboard 160, and exhausts the air from the exhaust port 127, the air may flow in the reverse direction. In this case, the exhaust port 127 is utilized as an intake, and the fan-cum-heat sink 110 exhausts the air from both of the top and bottom surfaces of the motherboard 160. Such a configuration may also exhibit dissipation effects, and the claimed invention is not intended to exclude the configuration.

Although the preferred embodiments of the present invention have been described above, the present invention is, needless to say, not restricted to these embodiments, and it is to be understood that various modifications and changes may be made without departing from the spirit and scope thereof. For example, the electronic apparatuses to which the inventive radiator mechanism is applicable are not limited to the notebook PCs, but may broadly include desktop PCs, word-processors, personal digital assistants (PDAs), or other portable electronic apparatuses (such as portable game machines, and various types of drives).

According to the inventive radiator mechanism and electronic apparatus, the lateral type cooling fan does not prevent the housing of electronic apparatus that accommodates the printed board from miniaturizing so much as the longitudinal type cooling fan does. In addition, heat at the back surface of the printed board may easily be dissipated as well with a single cooling fan, thereby preventing destruction, deterioration, and malfunction due to heat of the circuit components on the printed board.

What is claimed is:

1. An electronic apparatus comprising:
   a board, including a front surface and a back surface, on which an exoergic part is to be mounted, said board including a through hole;
   a heat pipe including a first portion disposed on the front surface and a second portion disposed on the back surface and connected to the first portion using the through hole,
   wherein the first portion is connected to the exoergic part; and
   a housing that houses said board and said heat pipe;
   wherein the first portion of the heat pipe runs parallel to the front surface and the second portion of the heat pipe runs parallel to the back surface.

2. The electronic apparatus according to claim 1, further comprising a heat sink that comprises a cooling fin mounted on the front surface of the board and a cooling fan disposed above the through hole.

3. The electronic apparatus according to claim 2, wherein the cooling fan rotates around an axis perpendicular to said front surface of said board, and absorbs air from said back surface of said board.

4. The electronic apparatus according to claim 3, wherein the cooling fan exhausts the air in a direction parallel to said front surface of said board, whereby the air flows over said heat sink.

5. The electronic apparatus according to claim 4, wherein the cooling fan and the heat sink are comprised in a fan-cum-heat sink unit.

6. The electronic apparatus according to claim 4, wherein at least a portion of the heat pipe runs parallel to the front surface and to the back surface.

7. An electronic apparatus comprising:
   a board, including a front surface and a back surface, on which an exoergic part is to be mounted, said board including a through hole;
   a cooling fan that rotates around an axis perpendicular to said front surface of said board, absorbs air from both faces of said cooling fan and exhausts in a direction parallel to said front surface of said board; and
   a housing that houses said board and said cooling fan;
   wherein said cooling fan dissipates heat through said through hole from the back surface of said board.

8. The electronic apparatus according to claim 7, further comprising a heat sink, wherein said cooling fan is provided in said heat sink.

9. The electronic apparatus according to claim 8, wherein said heat sink includes a plurality of cooling fins, and said cooling fan and said cooling fins are disposed in the same plane.

10. The electronic apparatus according to claim 7, wherein one of said exoergic part is a processor, said board is a motherboard, and said cooling fan is provided at the same surface as a surface on which said processor is located.

11. The electronic apparatus according to claim 7, further comprising a heat pipe, wherein said cooling fan cools heat conducted via said heat pipe.

12. The electronic apparatus according to claim 7, wherein said cooling fan includes an intake connected to said through hole.

13. The electronic apparatus according to claim 7, wherein the cooling fan comprises fan blades are oriented generally parallel to the axis of rotation of the cooling fan.

14. The electronic apparatus according to claim 7, wherein the through hole has an area of at least about 16 $\pi$ mm$^2$.

* * * * *